United States Patent
Bateman

(10) Patent No.: US 10,553,269 B2
(45) Date of Patent: Feb. 4, 2020

(54) HIGH-SPEED DATA TRANSFER PERIODS FOR THYRISTOR MEMORY CELL ARRAYS

(71) Applicant: TC Lab, Inc., Gilroy, CA (US)

(72) Inventor: Bruce L. Bateman, Fremont, CA (US)

(73) Assignee: TC Lab, Inc., Gilroy, CA (US)

( * ) Notice: Subject to any disclaimer, the term of this patent is extended or adjusted under 35 U.S.C. 154(b) by 0 days.

(21) Appl. No.: 16/124,133

(22) Filed: Sep. 6, 2018

(65) Prior Publication Data

US 2019/0378554 A1    Dec. 12, 2019

Related U.S. Application Data

(60) Provisional application No. 62/682,103, filed on Jun. 7, 2018.

(51) Int. Cl.
    *G11C 11/00*  (2006.01)
    *G11C 11/16*  (2006.01)
    *G11C 13/00*  (2006.01)

(52) U.S. Cl.
    CPC ...... *G11C 11/1693* (2013.01); *G11C 11/1659* (2013.01); *G11C 11/1673* (2013.01); *G11C 11/1675* (2013.01); *G11C 13/003* (2013.01); *G11C 13/004* (2013.01); *G11C 13/0004* (2013.01); *G11C 13/0061* (2013.01); *G11C 13/0069* (2013.01); *G11C 2213/71* (2013.01)

(58) Field of Classification Search
    CPC ............ G11C 11/1693; G11C 11/1659; G11C 11/1673; G11C 11/1675; G11C 13/003; G11C 13/004; G11C 13/0061; G11C 13/0069
    See application file for complete search history.

(56) References Cited

U.S. PATENT DOCUMENTS

2010/0293350 A1* 11/2010 Happ ................ G11C 11/16
                                                   711/162
2010/0315871 A1* 12/2010 Nemati .............. G11C 11/39
                                                   365/174

* cited by examiner

*Primary Examiner* — Uyen B Tran
(74) *Attorney, Agent, or Firm* — Aka Chan LLP

(57) ABSTRACT

Aspects of DDR and thyristor memory cell RAMs are optimally combined for high-speed data transfer into and out of RAMs. After a Read operation in which data from a selected row of memory cells in an array are latched, a Burst operation selectively moves the latched data from the array or latches external data. At the same time as the Burst data transfer, all the memory cells of the selected row are turned off or on by a write operation. In the following Write-Back & Pre-charge operation, the latched data bits which are complementary to the memory cell state of the Burst write operation are written back into the corresponding memory cells in the selected row. As part of a DDR-like activation cycle, data can be transferred to and from the memory cell array RAM at high-speed.

32 Claims, 8 Drawing Sheets

General DDR Operations

Direct Adaptation to DDR

HIGH-SPEED DATA TRANSFER PERIODS FOR THYRISTOR MEMORY CELL ARRAYS

CROSS-REFERENCE TO RELATED APPLICATIONS

This patent application claims priority from U.S. Provisional Patent Application No. 62/682,103, filed Jun. 7, 2018 and entitled, "High-Speed Transfer of Data To and From Thyristor Memory Cell Arrays," which is incorporated herein for all purposes.

BACKGROUND OF THE INVENTION

Random Access Memory (RAM) is a significant computer system element in which data is stored and retrieved. Heretofore DRAMs (Dynamic Random Access Memories) have constituted most of RAMs. DRAMs are integrated circuits which have the most data packing density with a single memory cell formed by a transistor and a capacitor, often termed 1T1C in abbreviated fashion.

But DRAM technology is nearing its end with the continuing shrinkage of feature dimensions and an emerging technology is thyristor-based memory cell RAMs. At very small dimensions, thyristor memory cell arrays have many advantages over DRAM memory cell arrays, including less power consumption and scalability for further shrinkage. As in the case of DRAMs, it is highly desirable that data be transferred at high-speed to and from thyristor memory cell array RAMs.

DDR provides a pathway in adapting thyristor memory cell RAMs to move data stored in a RAM memory cell array and of writing bit information into a RAM memory cell array for storage at high speed. A long-accepted standard for DRAM, DDR SDRAM (Double Data Rate Synchronous DRAM) standard, or more precisely, a series of standards, developed by JEDEC (Joint Electron Device Engineering Council), defines how bits are transferred to and from DRAM integrated circuits. The DDR SRAM (or DDR for short) standard also defines high speed transfer of bits to and from memory modules of DRAM integrated circuits along the buses of a computer system.

One approach toward adapting thyristor memory cell arrays to be compatible with DDR standards, specifically LPDDR4, is described in U.S. patent application Ser. No. 15/729,627, filed Oct. 10, 2017, entitled "DDR Controller for Thyristor Memory Cell Arrays," and assigned to the present assignee. Such direct approaches, more or less, of adapting the thyristor memory cell arrays to DDR standards have the advantage of the possibility of a straight-forward substitution of DDR DRAMs with thyristor memory cell RAMs or substitution with relatively minor changes. Nonetheless, thyristor memory cell arrays have different requirements than DRAMs and under certain circumstances problems may arise.

The present invention addresses these issues by another approach to DDR constraints for a robust mechanism for the high-speed transfer of data to and from thyristor memory cell arrays.

BRIEF SUMMARY OF THE INVENTION

The present invention provides for a method of transferring data to and from a plurality of memory cells in an array. The method has the steps of: in a first time period reading data from a selected row in the memory cell array and latching the data in a buffer; in a second time period transferring the data latched in the buffer from the memory cell array or transferring data into the memory cell array and latching the data in the buffer with no transfer of data between the buffer and the memory cell array, depending upon a selected direction of data transfer, and simultaneously setting all memory cells in the selected row in the memory cell array to a first logic state; and in a third time period writing a second logic state into memory cells in the selected row, the memory cells corresponding to the latched data in the second logic state, the first, second and third time periods forming a cycle for transferring data; whereby time constraints in writing data back from the buffer into the selected row of memory cells are relaxed.

The present invention also provides for an improved method of transferring data to and from a selected row of a random access memory. The method operates in an activation cycle transferring data to and/or from a random access memory cell array, the activation cycle having a Read operation in which data from a selected row of memory cells in the memory cell array is read and latched into a buffer, a Burst operation in which the latched memory cell row data is transferred from the random access memory cell array to an external location or external data is transferred into the random access memory cell array and latched in the buffer, and a Write-Recovery and Pre-charge operation in which the random access memory array is prepared for another activation cycle. Within the activation cycle the method has the steps: during the Burst operation, setting all memory cells in the selected row in a first logic state; and during the Write-Recovery and Pre-charge operation, writing a second logic state into memory cells in the selected row of memory cells corresponding to the latched data in the second logic state; whereby time constraints in writing data back from the buffer into the selected row of memory cells are reduced.

The present invention also provides for a method of transferring data into and out of the array of memory cells, the array of memory cells interconnected by a plurality of word lines and bit lines. The method has the steps of: latching a plurality of first data bits read from the memory cells connected to a selected word line; moving the plurality of first data bits to a location external to the array of memory cells or a plurality of second data bits from a location external to the memory cell array and latching the plurality of second data bits for the memory cells connected to the selected word line, and simultaneously writing a first logic state into all the memory cells connected to the selected word line; then writing latched second logic states into corresponding memory cells connected to the selected word line; whereby the transfer of data bits can be performed at high speed.

Other objects, features, and advantages of the present invention will become apparent upon consideration of the following detailed description and the accompanying drawings, in which like reference designations represent like features throughout the figures.

DETAILED DESCRIPTION OF THE INVENTION

To best explain the present invention, DDR (DRAMs) is first generally described. This is followed by a direct approach to adapt thyristor memory cell RAMs to DDR constraints for high-speed data transfer. It should be understood that a direct approach does not mean exact imitation of DDR operations since thyristor memory cell RAMs operate differently from DRAMs as will become apparent in the description below. Finally, the present invention is described by which aspects of DDR and thyristor memory cell RAMs are optimally combined for high-speed data transfer.

Basic Operations and Periods for DDR

DDR operations are based on an activation cycle in the DRAM array. The cycle starts with a Read operation in which the contents of a selected row (a page) are read and latched. This is followed by a Burst operation in which the latched data is moved to an external location or external data is moved into the DRAM and latched. The data is moved in groups and the bursts can go on indefinitely. After the Burst operation the page is closed by Writing Back the updated contents of the page into the row. Then the row is closed and the bit lines are Pre-charged for the next Activation cycle.

Figure 1:
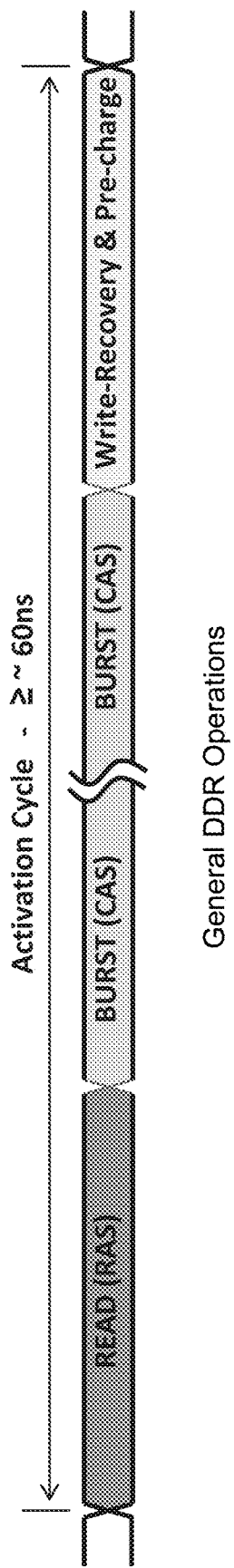
FIG. 1 represents the timing and periods for basic DDR operations.

More details of the activation cycle and its DDR period and operations are described with respect to FIG. 1. As summarized above, each DDR activation cycle has a Read period, a Burst period, and Write-Recovery & Pre-charge Period. The activation cycle causes a page of memory to be opened by selecting the appropriate word (row) line in the DRAM array. (A page is a fixed-length contiguous block of virtual memory, described by a single entry in the page table. It is the smallest unit of data for memory management in a virtual memory operating system and hence the smallest unit of data to move into, or from memory, in a computer system.)

The Read period starts the activation cycle. A Read operation reads out the contents, i.e., the stored logic states, of the selected row (page) in the DRAM through bit lines connected to each of the memory cells to sense amps/latches, collectively called the page buffer. These contents are latched into the page buffer of the DRAM as the memory cells in the selected row remain open.

The Burst period moves the page information stored in the page buffer to an external location, i.e., a computer bus, or moves external information into the page buffer. The burst "groups" of data are from a small number of adjacent "columns" in the selected row. The bursts can go on indefinitely reading groups out of the page and writing new groups back into the page. Each burst group is loaded from the page buffer into a DDR register, and then the DDR register is read sequentially, one word at a time.

A Write-Back operation is performed in the background via the bit line sense amplifiers via the still-open page. A Write period loads external data into a DDR register, one word at a time. The contents are then loaded into a Shadow Register for writing into the array (via the still-open page). While they are written, a new group can be loaded into the DDR register for a subsequent Write, if desired. DDR always writes the captured content of the page buffer back into the cell on the selected row as part of the activation cycle. This is necessary because in the 1-transistor, 1-capacitor DRAM the readout of the data in a cell destroys the content of the cell which thus requires that the sensed data be written back to the cell as part of the access.

A Pre-charge operation prepares the array for the next period after the final burst group has been read or written. In the case of a writing period, a Write-Recovery delay is needed to ensure that the last burst group is successfully written to the array before proceeding. The opened page is closed, which allows the bit lines to float and be charged back to the $V_{DD}/2$ level, i.e., the midpoint of the voltage swing on the DRAM array bit lines.

The minimum Activation cycle time interval is typically on the order 60 ns, ~15 ns for Read period, ~15 ns for Write-back and Pre-charge periods, leaving ~30 ns for the minimum Burst time. The maximum activation cycle time is indefinite with the increase in time being more time spent in the Burst period. These numbers reflect current semiconductor technology.

Direct Adaptation of Thyristor Memory Cell Arrays to DDR

Figure 2:
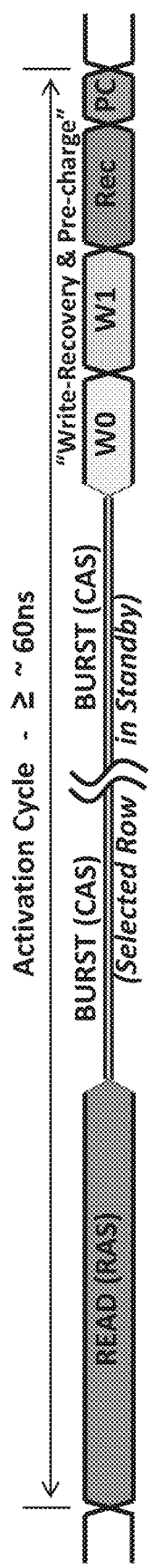
FIG. 2 represents the timing and periods for basic operations of a direct adaptation of thyristor memory cell arrays to DDR constraints.

A direct adaptation of DDR to thyristor memory cell arrays has certain benefits and advantages as described above. Such an adaption for thyristor memory cell RAMs to DDR is illustrated in FIG. 2. The DDR activation cycle is again separated into three general periods: Read periods, Burst periods, and Write-Recovery and Pre-charge periods.

The Read period is virtually identical to the conventional DDR periods in which the selected row of memory cells (page) is read and the read data latched into the page buffer. A time interval of approximately 15 ns passes from start of the Read period until the first burst allowed (sense amplifier latched and sense amplifier voltages stable).

The Burst period for the thyristor memory cell RAM is also similar to that of DDR DRAM. Page information stored in the page buffer is moved to an external location, i.e., a computer bus, or external information is moved into the page buffer. The burst "groups" of data from a small number of adjacent "columns" in the selected row are determined by data I/O word width and burst length move.

However, in case of the thyristor memory cell array, unlike the Burst period for DRAM DDR, the addressed (selected) row is not left open for write-back during Burst-in periods, but instead placed into standby mode with the selected word line at $V_{HOLD}$. Writes into the thyristor memory cell array require different voltage pulses for logic 1's versus logic 0's and thus cannot simply be "passed thru" the page buffer (sense-amps) as in the case of DRAMs. Thus the Write-Back to the row is performed during the following Write-Recovery & Pre-charge periods at the end of the activation cycle.

In the Write-Recovery & Pre-charge periods the thyristor memory cell array has four shorter sub-periods and operations: 1) a Write-back of the "0" bits; 2) a Write-back of the "1" bits; 3) a short "recovery" read pulse to repair "disturbs"

of the 0-bit levels caused by the Write-1 sub-operation period; and 4) a Pre-charge of the bit lines in preparation for the next activation cycle.

Figure 3A:
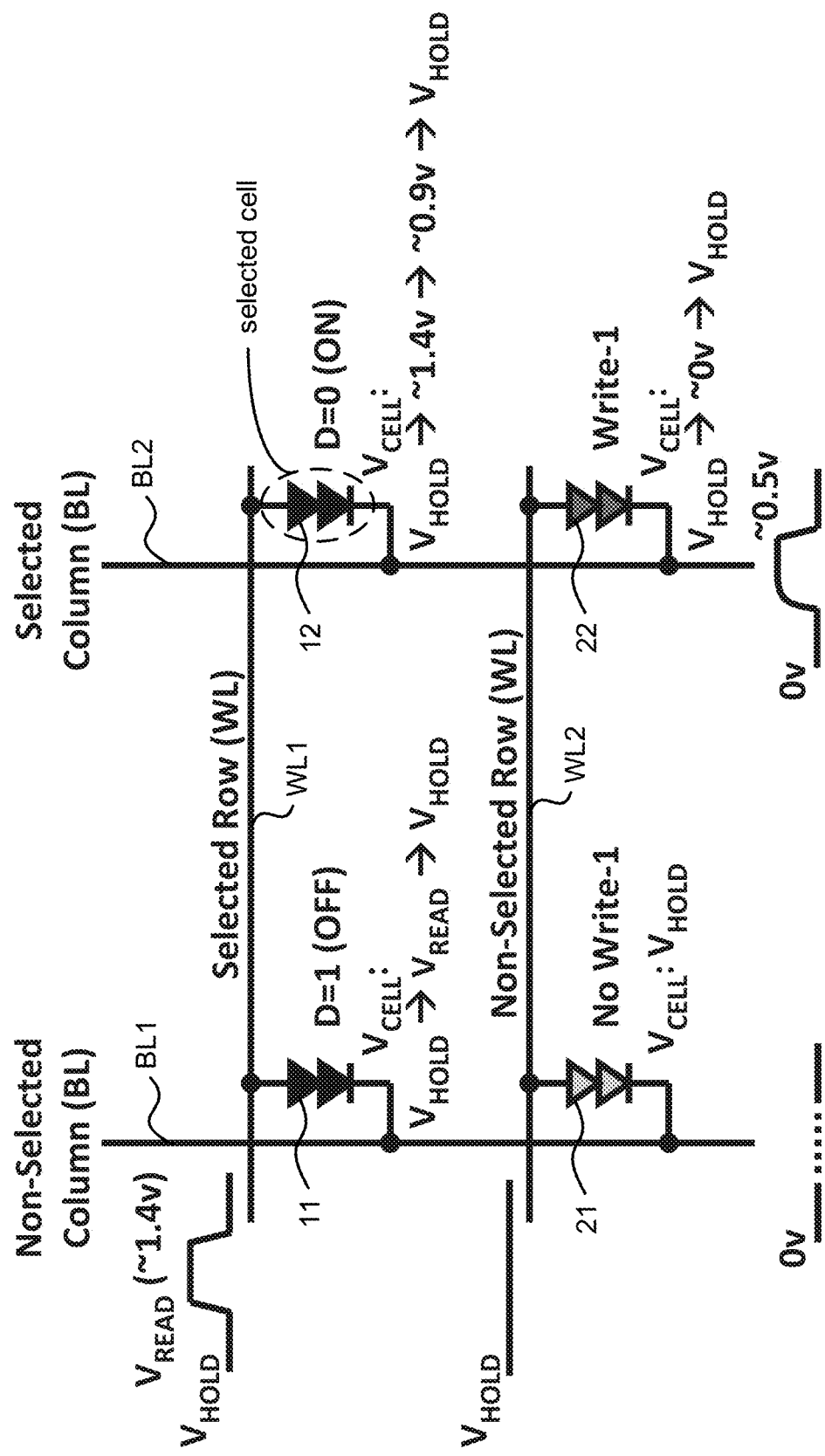
FIG. 3A represents a Read operation for a portion of a cross-point array of thyristor memory cells.
Figure 3B:
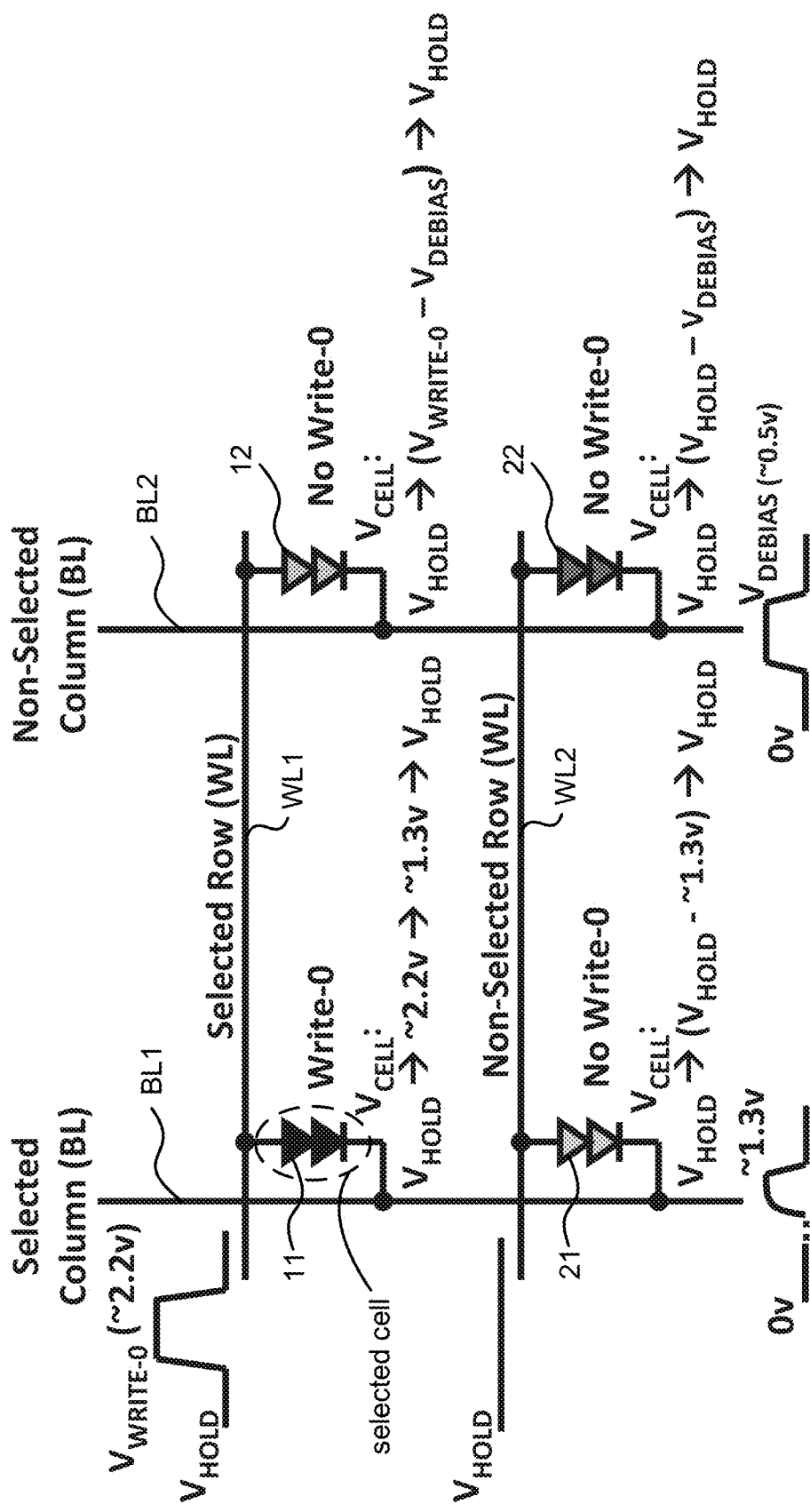
FIG. 3B represents a Write "0" operation for the portion of the FIG. 2 cross-point array.
Figure 3C:
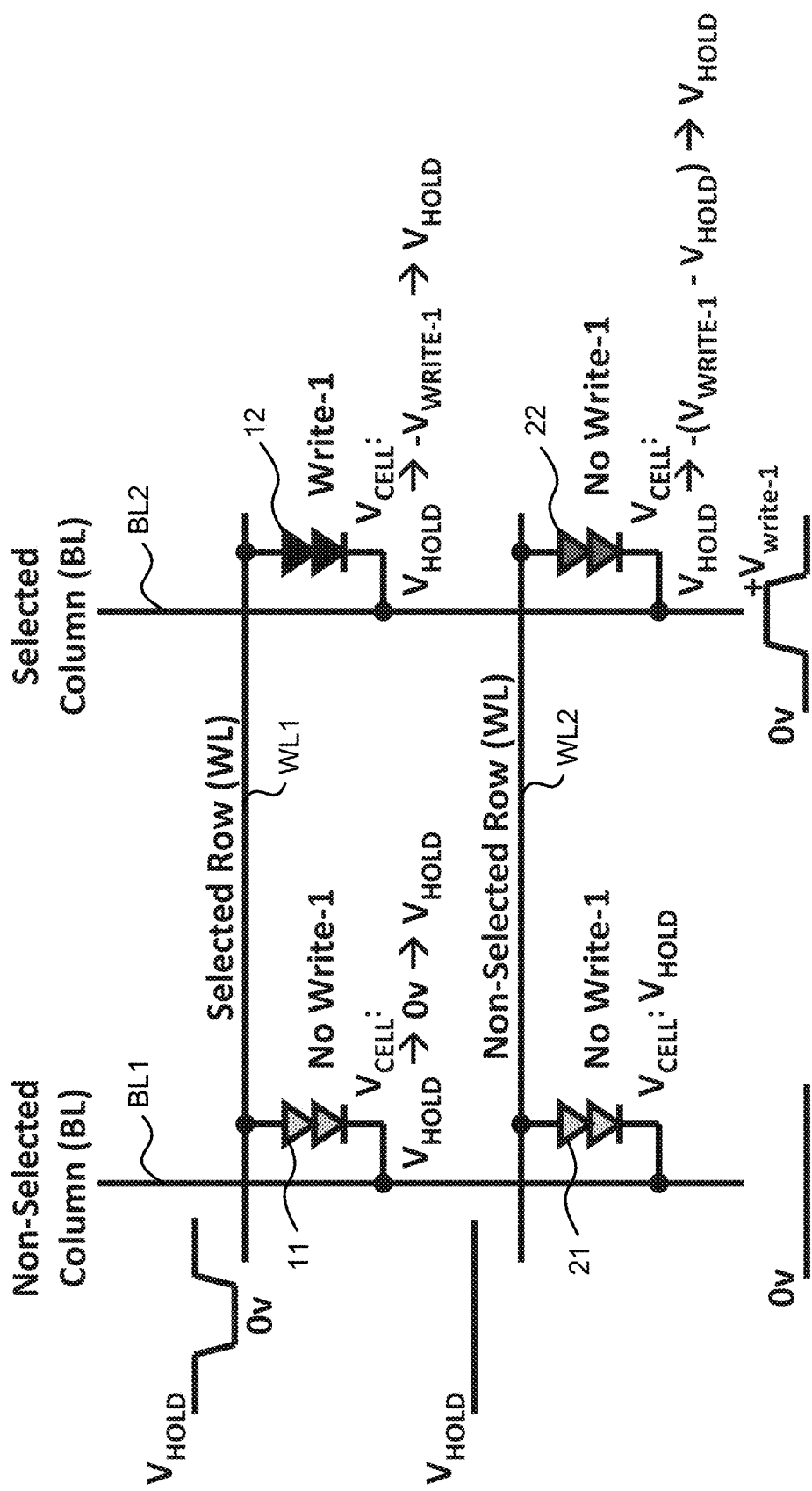
FIG. 3C represents a Write "1" operation for the FIG. 2 cross-point array portion.

The direct adaptation of thyristor memory cell RAM arrays to DDR constraints has problems under certain circumstances. Small representative arrays of thyristor memory cells in FIGS. 3A-3C illustrate the particular issues of reading and writing data in a thyristor memory cell array. The arrays have representative bit lines BL1 and BL2, which form the columns in the arrays, and representative word lines WL1 and WL2 which form the rows in the arrays. At the intersections of the bit lines and word lines are representative thyristor memory cells 11, 12, 21 and 22 to form a cross-point array.

FIG. 3A illustrates a Read period in the thyristor memory cell array. In this example the memory cell 12 which is ON (logic 0) at the intersection of the word line WL1 and the bit line BL2 is selected to be read. In the same row, the memory cell 11 is in the OFF state (logic state 1). Cells 21 and 22 are connected to the unselected word line WL2, and respectively to bit line BL1 and BL2 respectively.

During a Read operation the bit (column) lines are left floating about 0V. The unselected word (row) lines are kept at $V_{HOLD}$ (approximately 0.5V), a standby voltage sufficiently high with respect to 0V to maintain memory cells in their stored states, whether ON or OFF, but not high enough switch an OFF cell to the ON state. The selected word (row) line is pulsed from $V_{HOLD}$ to a read voltage $V_{READ}$, in this example, approximately 1.4V. For the memory cells connected to the selected word line WL1, the voltage on the bit line BL1 remains at 0V since the memory cell 11 is OFF. On the other hand, the voltage on the bit line BL2 rises from 0V to approximately 0.5V. The voltage across the selected memory cell 12 (which is ON) is first $V_{HOLD}$ ($V_{HOLD}$-0V) from the standby condition, then rises to 1.4V from the $V_{READ}$ pulse on the word line WL1, then falls to approximately 0.9V, as the thyristor memory cell 12 becomes fully ON. The voltage on the bit line BL2 is thus 1.4V–0.9V=0.5V. Then the bit line BL2 is pulled back to 0V by the bit line driver circuit at the end of the Read operation (in the same manner as the Precharge operation) when the row returns to standby.

Problems arise when the Read cycles are repeated because the OFF cells on the selected row are subject to repeated $V_{READ}$ (~1.4V) "pulses". This slowly disturbs the OFF memory cells towards the ON state.

A Write-0 operation in the thyristor memory cell array is illustrated in FIG. 3B. In this example a logic 0 (turning the memory cell ON) is written into the selected memory cell 11. To do so the selected word line WL1 for the memory cell 11 is raised from the standby voltage $V_{HOLD}$ to $V_{WRITE-0}$, approximately 2.2V, and the selected bit line BL1 is set at 0V. The unselected word lines, represented by line WL2, are kept at $V_{HOLD}$ and the unselected bit lines, represented by BL2, are set at 0V and then pulsed to $V_{DEBIAS}$, approximately 0.5V. $V_{DEBIAS}$ is selected to mitigate the effects of the Write-0 pulse on non-selected cells. In the Write-0 period the $V_{WRITE-0}$ pulse of a full 2.2V is imposed across the selected memory cell 11 at first. This voltage turns ON the cell 11 so that there is an approximately 0.9V drop across the cell pulling up the bit line BL1 to 1.3V (2.2V-0.9V) before the WL1 voltage is dropped back to $V_{HOLD}$. As this occurs, the 1.3V on the bit line BL1 is not sufficient to change the logic state of the half-selected cell 21 with its word line WL2 at $V_{HOLD}$. At the same time the half-selected cell 12 sees the 2.2V pulse on its word line WL1 minus a 0.5V ($V_{DEBIAS}$) pulse on its bit line BL2 before returning to the standby condition of $V_{HOLD}$—0V. The non-selected cells, e.g., cell 22, see a voltage of $V_{HOLD}$, a pulse of approximately of 0V and then a return to $V_{HOLD}$. Hence the logic state of the cell 22 remains unchanged.

Nonetheless, problems occur with repeated Write-0 cycles. The OFF cells on a selected row see repeated $V_{WRITE-0}$ (~2.2V) pulses which slowly disturbs these OFF cells towards ON states. The ON cells in the non-selected rows see repeated pulses of $V_{HOLD}$ ($V_{BL-RISE}$ or $V_{DEBIAS}$) which slowly disturbs the ON cells towards OFF states.

A Write-1 (the memory cell OFF) operation is illustrated in FIG. 3C. In this example, the selected memory cell is represented by cell 12. The selected word line WL1 is pulsed to 0V from the standby voltage $V_{HOLD}$ and the selected bit line BL2 pulsed to $V_{WRITE-1}$ from the standby 0V. Hence the selected cell 12 sees an initial voltage of $V_{HOLD}$, then a pulse of –$V_{WRITE-1}$, before a return to $V_{HOLD}$ The sufficiently large negative voltage pulse of –$V_{WRITE-1}$ applied to the selected cell 12 is sufficient to turn it OFF. The non-selected word lines represented by word line WL2 are kept at $V_{HOLD}$ and the non-selected bit lines represented by bit line BL1 at 0V. The half-selected cell 11 initially sees a voltage of $V_{HOLD}$, followed by a pulse of 0V, before a return to 0V. This is insufficient to change the logic state of the memory cell. The half-selected memory cell 22 sees $V_{HOLD}$ initially, then a pulse of —($V_{WRITE-1}$-$V_{HOLD}$), before a return to $V_{HOLD}$. Mitigated by the $V_{HOLD}$ voltage, the $V_{WRITE-1}$ voltage is insufficient to turn OFF the half-selected memory cell 22 so that its initial logic state is maintained. The non-selected memory cell, represented by the cell 21, sees a continuous $V_{HOLD}$ during the Write-1 period and so maintains its logic state.

Problems arise from repeated Write-1 cycles. The half-selected cells on the selected row see 0V "pulses" during the word line pulse which disturbs an ON cell towards the OFF state. A "recovery pulse" (a short read) is required on the row to repair this ON state disturb. Furthermore, the half-selected cells on the selected bit line see—($V_{WRITE-1}$-$V_{HOLD}$) pulses (negative voltage) during the Write-1 bit line pulse. In one cycle this is insufficient to turn OFF memory cells which are ON, but these pulses slowly disturb the ON cells towards the OFF state so repeated Write-1 cycles become problematical.

Figure 4:
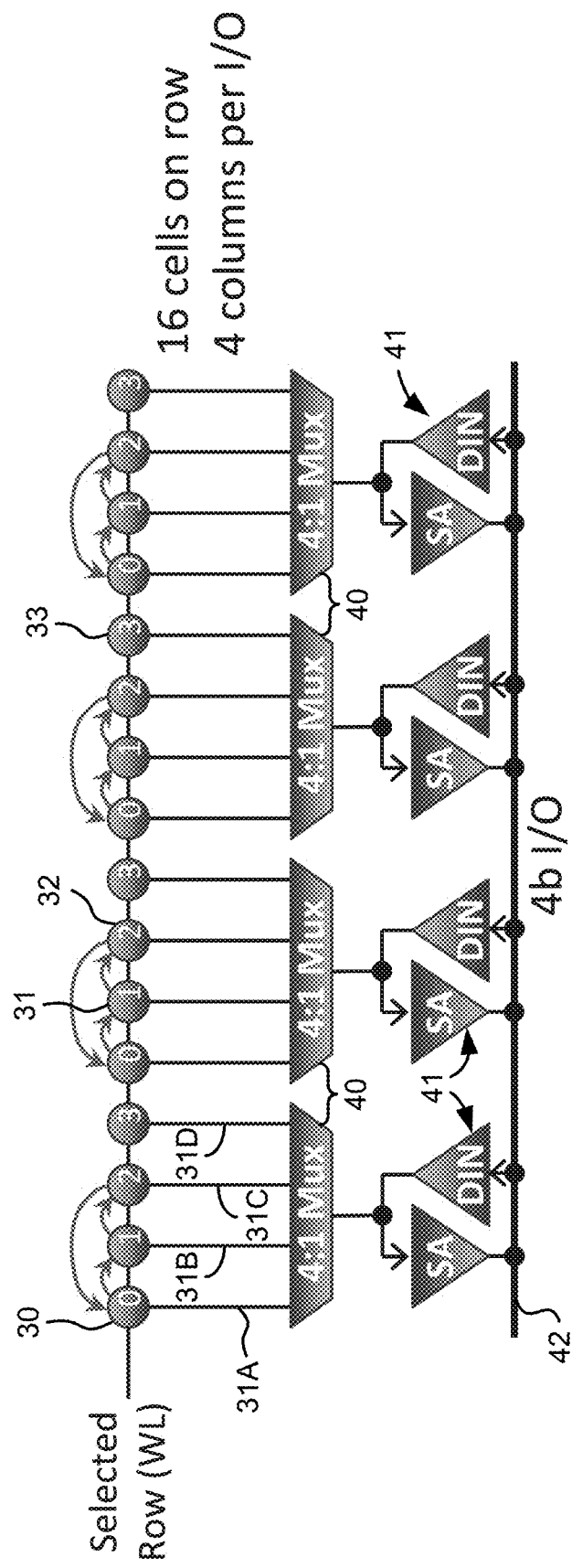
FIG. 4 shows a thyristor memory array with multiplexers/demultiplexers between the bit lines and sense amps/latches.

As explained above, there are differences between the conventional DDR (DRAM) and the direct DDR approach to thyristor memory cell RAMs. Besides the nature of Write operations in thyristor memory cell RAMs compared to DRAMs, data is read in I/O (input/output) word size groups only (there is no page and burst). The number of sense-amps and latches is reduced to just the word size and many columns on a row are multiplexed to feed a single sense-amp per bit in the I/O word as illustrated in FIG. 4 in which a generalized thyristor memory cell array is simplified by showing only a single row of cells representing a selected word line in an activation cycle. In this example the word is 4 bits so that every four thyristor memory cells 30A-30D are connected to a multiplexer/demultipler 40 which has an output connected to a sense amp and latch circuit 41 (the equivalent of the page buffer for the DDR DRAMs). The circuits 41 are also connected to a 4-bit I/O bus which can move the bits from the circuits 41 to an external location or move external bits into the circuits 41.

Words are randomly read from any row in the RAM on the fly at minimum cycle time. This necessitates the back-to-back writing of 1-bit and 0-bits in the word. An example is an access sequence of a loop which performs a Read (or Write) from (to) cell 30A, from (to) 30B, from (to) 30C, from (to) 30A from (to) 30B and so forth for each group of 4 bit (column) lines 31A-31D of each bit in the I/O bus. Cell 30D is never accessed during the loop but receives every Read and Write-0 pulse on the word (row) line. Cell 30D slowly accumulates the disturb effects of OFF states toward the ON state. Eventually the data in each cell 30D is flipped from OFF to ON.

The repeated application of Write-0 and Read pulses to a single word line in an array for different I/O words on the row creates a strong disturb effect on unread cells of that row. This can lead to loss of data in words of the row that are not read out during repeated accesses to other words on that same row and is a very difficult disturb mechanism to solve in the thyristor memory cell cross-point arrays.

Another problem of the direct approach to a DDR for thyristor memory cell RAMs is to fit three access sub-periods (Write-0, Write-1, Recovery) in the approximate 15 ns allocated to the Write-Recovery & Pre-charge period at the end of the activation cycle. This leaves only about 4.5 ns for each of these sub-periods during which each requires a pulse, i.e., Write-0, Write-1, and Recovery. But the Write speed for the thyristor memory cells is a strong function of the applied Write voltage. A narrower pulse necessitates using higher voltages for the pulses. But in general the highest external supply voltage available in the current DRAM datasheets is $V_{pp}$=2.5V which may not be adequate for Write-0 operation with the constrained short pulse width. It is not practical to use charge-pumps to generate the Write-0 pulse voltage on the selected word line because in thyristor memory cell cross-point arrays the Write-0 period draws significant peak current through the word line. This current would necessitate a very high power and physically large charge-pump circuit block, a significant drain of semiconductor resources. Thus it is very desirable to keep the Write-0 voltage below 2.5V which is difficult with limited time available for the three pulse sequences in the Write-recovery/Pre-charge time at the end of the cycle.

The Present Invention

Figure 5:
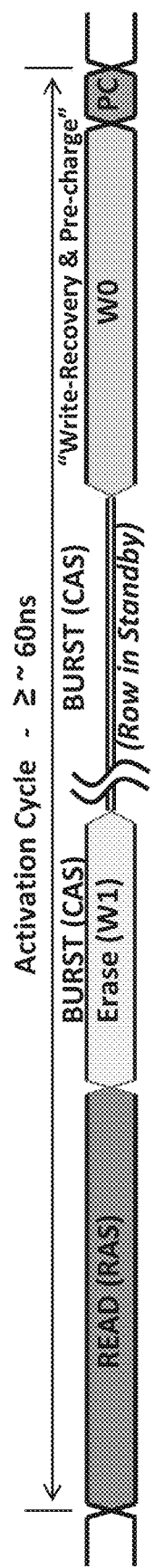
FIG. 5 represents the timing and periods for basic operations for adapting thyristor memory cell arrays to DDR constraints for high-speed transfer of data bits according to one embodiment of the present invention.

To address these issues the present invention combines aspects of DDR and thyristor memory cell RAMs. For the high-speed transfer of data an activation cycle like that of DDR uses three general periods. The activation cycle of the present invention is illustrated by FIG. 5.

The activation cycle starts with a Read period very similar to the previously described Read period of DDR for DRAMs and thyristor memory cell RAMs. Data from a selected word line (and selected by multiplexers) are read and stored in sense amps and latches, a buffer similar to the page buffer in DRAM. This is followed by a Burst period. Data is transferred from/to the sense amps/latches in groups of adjacent "columns" determined by data I/O word width and burst length. But unlike previously described Burst periods, the entire selected row is written into a logic 1 or logic 0 state. In the third period of the cycle, the Write Recovery & Pre-charge period, the cells in the selected row corresponding to the opposite logic state to that in the Burst period are written back.

With respect to the Burst period, DDR procedure has a write-back of data into the selected row at the end of the cycle. In the direct approach of DDR thyristor memory cell RAM, the row is returned to the standby mode during the Burst period with the word line held at the "hold" voltage for data retention. In the present invention the time available in the Burst period is used for one of the two Write pulses necessary for Writes in the thyristor memory cell array. That is, as burst data is transferred as previously described, a Write operation is performed upon the thyristor memory cells of the selected row. It is preferred that the Write pulse turn OFF (logic state 1) all the memory cells in the row. It is also be possible to use the Burst period to set all the memory cell to the ON state (logic 0).

The Write-1 operation and pulse to turn OFF all the cells in the selected word (row) line is preferable because no DC current flows through a thyristor memory cell when the negative voltage is applied to the cell for the Write-1 pulse. Thus lower power is consumed compared to a Write to the ON state (logic state 0). The Write-1 pulse width can be increased to something slightly less than the minimum 30 ns Burst time present for a minimum 60 ns activation cycle. Furthermore, placing the Write-1 pulse before the Write-0 pulse eliminates the disturb of the freshly written ON states by the subsequent Write-1 pulse observed in the direct approach for DDR thyristor memory cell RAMs. The recovery "read" pulse that is used to repair the disturb damage to the ON cell from the Write-1 pulse can thus be eliminated. This implies that there is only one pulse in the Write-Recovery period, instead of three pulses. Thus the width of the Write-0 pulse in the Write-Recovery & Pre-charge period can be tripled and no need for a high voltage pulse.

Figure 6:
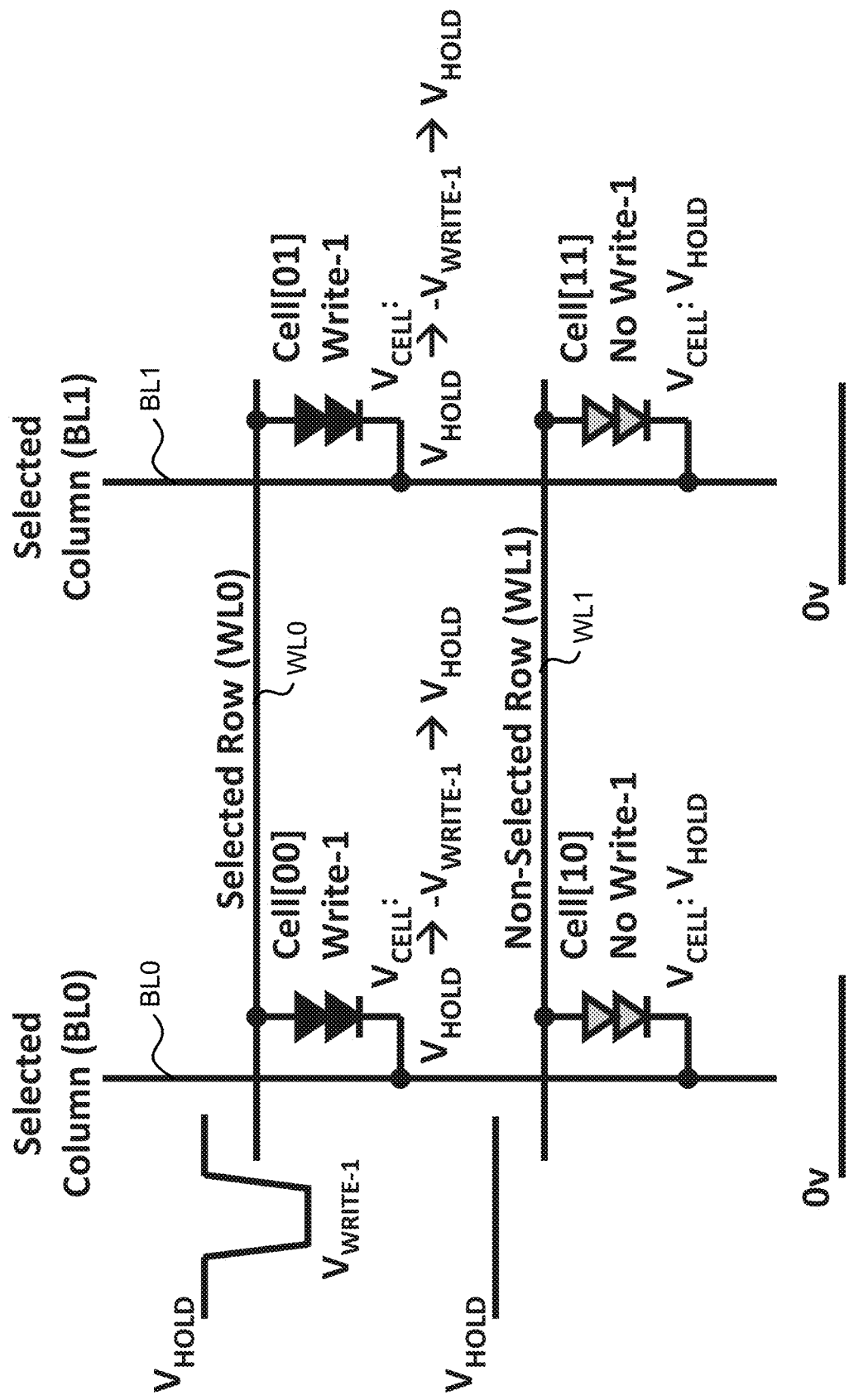
FIG. 6 shows an erase, a Write-1, operation of all the cells on a selected word (row) line in a representative thyristor memory cell array according to one embodiment of the present invention.

FIG. 6 shows the full row (write line) Write-1 operation with a small representative thyristor memory cell array. To turn OFF all the memory cells on the selected word line WL0, i.e., the representative cells 00 and 01, the voltage on the line WL0 is pulsed from an initial voltage of $V_{HOLD}$ to $N_{WRITE-1}$, before a return to $V_{HOLD}$, the standby condition. The non-selected word lines, represented by WL1, are kept at $V_{HOLD}$ and the bit (column) lines, represented by bit lines BL0 and BL1, are kept at 0V. The sufficiently large negative voltage pulse of $-V_{WRITE-1}$ is sufficient to turn OFF the representative cells 00 and 01 on the word line. The cells 10 and 11 on the non-selected word line WL1 memory cell see a continuous $V_{HOLD}$ during the Write-1 period and so maintain their logic states.

The advantages with of the full row erase include the elimination of all disturb mechanisms associated with the Write-1 operation. All cells on the selected row are erased, i.e., turned OFF, there are no ON bit disturb events present. All cells on the non-selected word (row) lines remain in the DC standby condition; there are no non-selected row disturb mechanisms; no bit line DEBIAS pulses are required. Power consumption is reduced with only a single row "capacitive-only" charge-discharge pulse. Minimal charge-pump circuitry is required.

Figure 7:
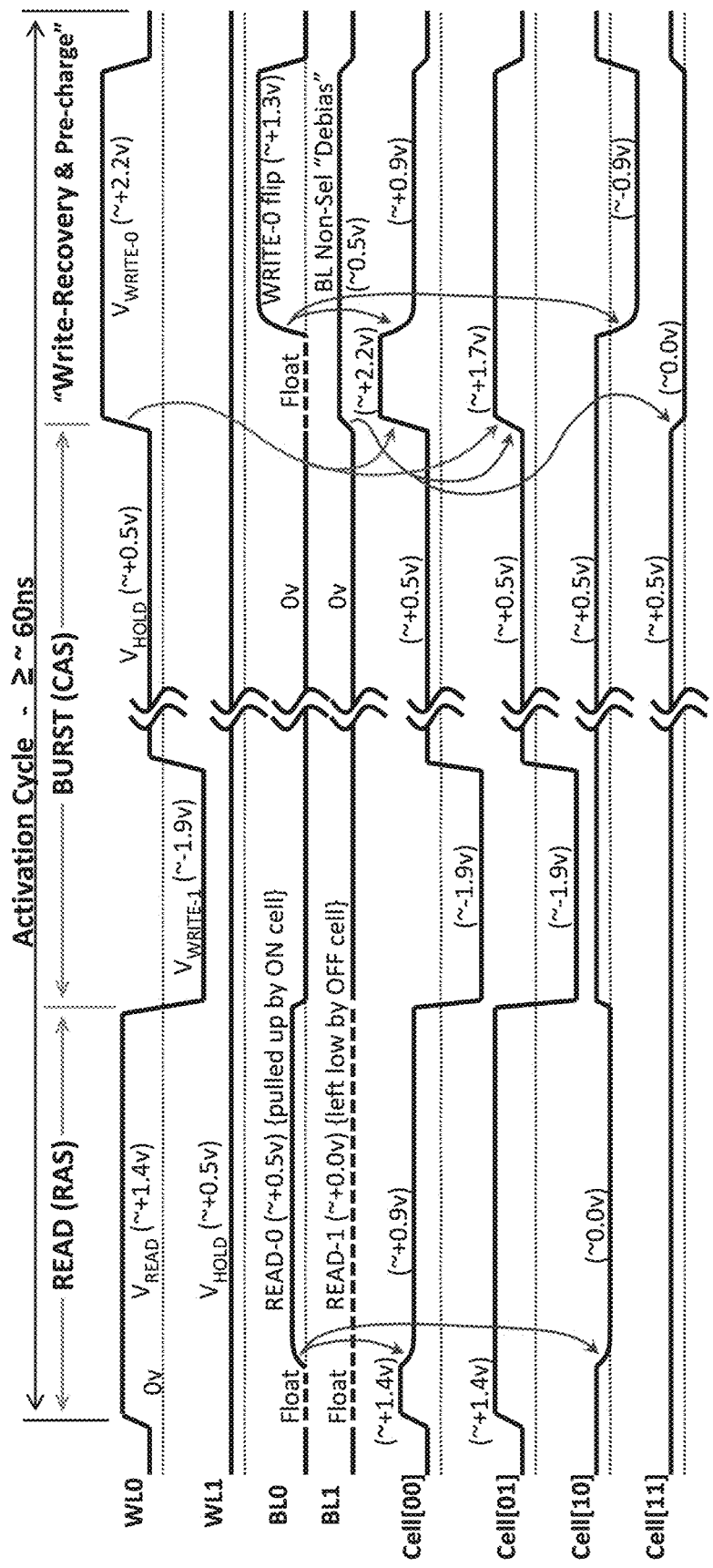
FIG. 7 shows the timing and various signal waveforms for operations in a thyristor memory cell array in accordance with one embodiment of the present invention.

The voltage waveforms and their timing for the Read/Write-1 (Erase)/Write-0 periods are illustrated in FIG. 7 for further details and completeness.

Alternatively, it is also be possible to use the Burst period to set all the bits in the selected row to the ON state and then use the Write-Recovery period to write selected bits to the OFF state. Of course, some of the advantages described above are lost.

The present invention has been described with thyristor memory cell arrays. These thyristor memory cell arrays include vertical thyristor memory cell RAMs, such as described in U.S. Pat. No. 9,837,418, which issued Dec. 5, 2017; horizontal thyristor cell arrays, such as described in U.S. Pat. No. 9,449,669; and 3D thyristor memory cell arrays, such as described in U.S. application Ser. No. 16/033,190, filed Jul. 11, 2018, and U.S. application Ser. No. 16/007,992, filed Jun. 13, 2018; all of which are assigned to the present assignee. The described invention might also be useful beyond thyristor memory cell RAMs. Random access memories formed from magneto-resistive memory cells, phase-change memory cells, resistive memory cells, nanowire or graphene memory cells may also benefit from the described invention so that data can be transferred to or from these memory arrays at high-speeds.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method of transferring data to and from a plurality of memory cells in an array, the method comprising:
   in a first time period reading data from a selected row in the memory cell array and latching the data in a buffer;
   in a second time period transferring the data latched in the buffer from the memory cell array or transferring data into the memory cell array and latching the data in the buffer with no transfer of data between the buffer and the memory cell array, depending upon a selected direction of data transfer, and simultaneously setting all memory cells in the selected row in the memory cell array to a first logic state; and
   in a third time period writing a second logic state into the memory cells in the selected row, the memory cells corresponding to a latched data in the second logic state, the first, second and third time periods forming a cycle for transferring data;
   whereby time constraints in writing data back from the buffer into the selected row of memory cells are relaxed.

2. The method of claim 1 wherein the step of simultaneously setting all the memory cells in the selected row in the memory cell array to the first logic state is completed before transferring all the data latched in the buffer from the memory cell array or transferring all the data into the memory cell array and latching the data in the buffer.

3. The method of claim 2 wherein the step of setting all the memory cells in the selected row in the memory cell array to the first logic state comprises turning off all the memory cells in the selected row.

4. The method of claim 3 wherein the step of writing the second logic state into the memory cells in the selected row corresponding to the latched data in the second logic state comprises turning on the memory cells in the selected row corresponding to the latched data in the second logic state.

5. The method of claim 2 wherein the step of setting all the memory cells in the selected row in the memory cell array to the first logic state comprises turning on all the memory cells in the selected row.

6. The method of claim 5 wherein the step of writing the second logic state into the memory cells in the selected row corresponding to the latched data in the second logic state comprises turning off the memory cells in the selected row corresponding to the latched data in the second logic state.

7. The method of claim 1 wherein the memory cells comprise thyristor memory cells.

8. The method of claim 7 wherein the thyristor memory cells are arranged in a cross-point array.

9. The method of claim 8 further comprising preparing a thyristor memory cell array for another cycle of data transfer.

10. The method of claim 9 wherein the thyristor memory cell array comprises bit lines transferring data between the buffer and the thyristor memory cell array and the step of preparing the thyristor memory cells comprises pre-charging the bit lines.

11. The method of claim 7 wherein the thyristor memory cells comprise vertical thyristor memory cells.

12. The method of claim 7 wherein the thyristor memory cells comprise thyristor memory cells in a three-dimensional array.

13. The method of claim 1 wherein the memory cells comprise memory cells selected from a group consisting of magneto-resistive memory cells, phase-change memory cells, and resistive memory cells.

14. In an activation cycle transferring data to and/or from a random access memory cell array, the activation cycle having a Read operation in which data from a selected row of memory cells in the memory cell array is read and latched into a buffer, a Burst operation in which the latched memory cell row data is transferred from the random access memory cell array to an external location or external data is transferred into the random access memory cell array and latched in the buffer, and a Write-Recovery and Pre-charge operation in which the random access memory array is prepared for another activation cycle, an improved method of transferring data to and from the selected row comprising:
   during the Burst operation, setting all memory cells in the selected row in a first logic state; and
   during the Write-Recovery and Pre-charge operation, writing a second logic state into the memory cells in the selected row of memory cells corresponding to the latched data in the second logic state;
   whereby time constraints in writing data back from the buffer into the selected row of memory cells are reduced.

15. The method of claim 14 wherein the step of setting all the memory cells in the selected row in the first logic state is performed at a beginning of the Burst operation.

16. The method of claim 14 wherein the memory cells comprise thyristor memory cells.

17. The method of claim 16 wherein the first logic state in a memory cell comprises an ON state and the second logic state in a memory cell comprises an OFF state.

18. The method of claim 16 wherein the first logic state in a memory cell comprises an OFF state and the second logic state in a memory cell comprises an ON state.

19. The method of claim 16 wherein the thyristor memory cells comprise vertical thyristor memory cells.

20. The method of claim 16 wherein the thyristor memory cells comprise thyristor memory cells in a three-dimensional array.

21. The method of claim 14 wherein the memory cells comprise memory cells selected from a group consisting of magneto-resistive memory cells, phase-change memory cells, or resistive memory cells.

22. In an array of memory cells interconnected by a plurality of word lines and bit lines, a method of transferring data into and out of the array of memory cells, comprising:
   latching a plurality of first data bits read from the memory cells connected to a selected word line;
   moving the plurality of first data bits to a location external to the array of memory cells or a plurality of second data bits from a location external to the memory cell array and latching the plurality of second data bits for the memory cells connected to the selected word line, and simultaneously writing a first logic state into all the memory cells connected to the selected word line;

then writing latched second logic states into corresponding memory cells connected to the selected word line;

whereby a transfer of data bits can be performed at high speed.

23. The method of claim 22 wherein the array of memory cells comprises a cross-point array of thyristor memory cells.

24. The method of claim 22 wherein the array of memory cells comprises a cross-point array of memory cells, the memory cells from a group consisting of magneto-resistive memory cells, phase-change memory cells, or resistive memory cells.

25. The method of claim 22 wherein the step of simultaneously writing the first logic state comprises turning off all the memory cells connected to the selected word line.

26. The method of claim 22 wherein the step of writing latched second logic states into corresponding memory cells connected to the selected word line comprises turning on the corresponding memory cells.

27. The method of claim 22 further comprising:
after the step of writing latched second logic states, precharging the bit lines;
whereby the bit lines are prepared for a repetition of the steps of latching, moving and simultaneously writing, and writing latched second logic states for another selected word line.

28. The method of claim 22 wherein the each step of latching the plurality of first data bits and of writing latched second logic states has a predetermined time interval in which the step must be performed, and the step of moving the plurality of first data bits and simultaneously writing the first logic state has a predetermined minimal time interval beyond which the steps of transferring and simultaneously writing must be performed.

29. The method of claim 28 wherein the predetermined time interval for the step of latching the plurality of first data bits corresponds to a Read period, the predetermined minimal time interval for the step of writing the first logic state corresponds to a Burst period, and the step of writing latched second logic states corresponds to a Write-Recovery & Pre-charge period, a DDR (Double Data Rate) standard.

30. The method of claim 22 further comprising:
upon completing the step of simultaneously writing the first logic state, placing the memory cells connected to the selected word line in a standby condition.

31. The method of claim 22 wherein the step of simultaneously writing the first logic state comprises:
setting a first voltage upon the selected word line; and
setting a second voltage upon all the bit lines so as to impose a voltage across all the memory cells connected to the selected word line so that the memory cells are written into the first logic state.

32. The method of claim 31 wherein the step of simultaneously writing the first logic state further comprises:
setting a third voltage upon all the word lines except the selected word line so that a voltage imposed across all memory cells not connected to the selected word line is insufficient to affect any of logic states of the memory cells not connected to the selected word line.

* * * * *